United States Patent
Hong et al.

(10) Patent No.: US 7,863,911 B2
(45) Date of Patent: Jan. 4, 2011

(54) TEST DEVICE AND METHOD FOR MEASUREMENT OF TUNNELING MAGNETORESISTANCE PROPERTIES OF A MANUFACTURABLE WAFER BY THE CURRENT-IN-PLANE-TUNNELING TECHNIQUE

(75) Inventors: Ying Hong, Morgan Hill, CA (US); Wipul P. Jayasekara, Los Gatos, CA (US); Daniele Mauri, San Jose, CA (US); David J. Seagle, Morgan Hill, CA (US)

(73) Assignee: Hitachi Global Storage Technologies, Netherlands, B.V., Amsterdam (NL)

( * ) Notice: Subject to any disclaimer, the term of this patent is extended or adjusted under 35 U.S.C. 154(b) by 545 days.

(21) Appl. No.: 12/006,322

(22) Filed: Dec. 31, 2007

(65) Prior Publication Data

US 2009/0168254 A1    Jul. 2, 2009

(51) Int. Cl.
*G01R 27/08* (2006.01)
*G01R 31/08* (2006.01)
*G01R 31/02* (2006.01)

(52) U.S. Cl. .................. 324/715; 324/525; 324/755
(58) Field of Classification Search ............ 324/525, 324/715, 755
See application file for complete search history.

(56) References Cited

U.S. PATENT DOCUMENTS

| | | | |
|---|---|---|---|
| 6,552,554 B1 | 4/2003 | Prinz et al. | |
| 6,731,110 B2 * | 5/2004 | Church | 324/210 |
| 6,879,473 B2 | 4/2005 | Sone et al. | |
| 6,927,569 B2 | 8/2005 | Worledge et al. | |
| 7,149,105 B2 | 12/2006 | Brown et al. | |
| 7,619,431 B2 * | 11/2009 | De Wilde et al. | 324/763 |
| 2005/0185454 A1 | 8/2005 | Brown et al. | |
| 2006/0202692 A1 | 9/2006 | Tatschl et al. | |
| 2006/0274456 A1 | 12/2006 | Hayashi et al. | |
| 2007/0070553 A1 | 3/2007 | Tsunekawa et al. | |

OTHER PUBLICATIONS

Jo, et al., "Magnetotransport and Interface Magnetism in Manganite Heterostructures: Implications for Spin Polarized Tunneling", *Country of Publication: USA*, (2001),3-8.
Ounadjela, et al., "Spin Polarized Electronic Reflections At Metal-Oxide Interfaces: A Technique for Characterizing Tunneling Barriers in Magnetic Random Access memory Devices", *American Institute of Physics*, (May 15, 2002).
Jo, et al., "Magnetotransport and Interface Magnetism in Manganite Heterostructures: Implications for Spin Polarized Tunneling", *Materials Research Society Symposium-Proceedings*, (2000),3-8.

* cited by examiner

*Primary Examiner*—Amy He

(57) ABSTRACT

A combined manufacturable wafer and test device for measuring a tunneling-magnetoresistance property of a tunneling-magnetoresistance, sensor-layer structure. The combined manufacturable wafer and test device comprises a tunneling-magnetoresistance, sensor-layer structure disposed on a substrate. The combined manufacturable wafer and test device also comprises a plurality of partially fabricated tunneling-magnetoresistance sensors; at least one of the partially fabricated tunneling-magnetoresistance sensors is disposed at one of a plurality of first locations. The test device is disposed on the substrate at a second location different from the plurality of first locations. The test device allows measurement of the tunneling-magnetoresistance property of the tunneling-magnetoresistance, sensor-layer structure using a current-in-plane-tunneling technique.

20 Claims, 12 Drawing Sheets

800

PERFORM A HYDROGEN/NITROGEN, PLASMA ASHING OF A SURFACE OF THE TMR SENSOR-LAYER STRUCTURE BEFORE FABRICATING ON THE SURFACE THE SECOND ELECTICAL-CONTACT LAYER
810

DEPOSIT AN ELECTRICALLY CONDUCTIVE MASK
ALIGNMENT LAYER
910

MEASURE THE TMR PROPERTY SELECTED FROM A GROUP CONSISTING OF A TMR RATIO OF THE SENSOR-LAYER STRUCTURE AND A RESISTANCE-AREA PRODUCT OF THE SENSOR-LAYER STRUCTURE
1010

TEST DEVICE AND METHOD FOR MEASUREMENT OF TUNNELING MAGNETORESISTANCE PROPERTIES OF A MANUFACTURABLE WAFER BY THE CURRENT-IN-PLANE-TUNNELING TECHNIQUE

TECHNICAL FIELD

Embodiments of the present invention relate generally to the field of tunneling magnetoresistance (TMR) sensor-layer structure testing and characterization.

BACKGROUND

Magnetic sensors and in particular magnetic-recording sensors are complex devices fabricated by sensor-layer-structure deposition processes. The performance of magnetic sensors depends critically on the quality and properties of the sensor-layer-structure from which the sensors are fabricated. It is essential to be able to accurately characterize parameters related to these properties during the fabrication process.

In particular, recent advances in technology such as TMR sensor technology have made properties related to the magnetic-recording sensor of critical importance for quality control, because properties, for example, amplitude and sensitivity, of the magnetic-recording sensor depend critically on the quality of the TMR sensor-layer structure. The necessity of controlling of the properties of the TMR sensor-layer structure and their accurate characterization has been further increased by the use of nanostructures in the thin films comprising the TMR sensor-layer structure. Moreover, miniaturization to meet the demands of higher recording densities has created a greater need for accurately determining parameters characterizing the TMR sensor-layer structure.

SUMMARY

Embodiments of the present invention comprise a combined manufacturable wafer and test device for measuring a TMR property of a TMR sensor-layer structure. The combined manufacturable wafer and test device comprises a TMR sensor-layer structure disposed on a substrate. The combined manufacturable wafer and test device also comprises a plurality of partially fabricated TMR sensors; at least one of the partially fabricated TMR sensors is disposed at one of a plurality of first locations. The test device is disposed on the substrate at a second location different from the plurality of first locations. The test device allows measurement of the TMR property of the TMR sensor-layer structure using a current-in-plane-tunneling (CIPT) technique.

DESCRIPTION OF THE DRAWINGS

The accompanying drawings, which are incorporated in and form a part of this specification, illustrate embodiments of the invention and, together with the description, serve to explain the embodiments of the invention:

FIG. 8 is a flow chart further illustrating a method for measuring a TMR property of a TMR sensor-layer structure of a manufacturable wafer with a test device and elaborating the method of preparing the surface of the TMR sensor-layer structure for fabricating the second electrical-contact layer of the test device thereon in an embodiment of the present invention.

FIG. 9 is a flow chart further illustrating a method for measuring a TMR property of a TMR sensor-layer structure of a manufacturable wafer with a test device and elaborating the method of fabricating the second electrical-contact layer of the test device in an embodiment of the present invention.

The drawings referred to in this description should not be understood as being drawn to scale except if specifically noted.

DESCRIPTION OF EMBODIMENTS

Reference will now be made in detail to the alternative embodiments of the present invention. While the invention will be described in conjunction with the alternative embodiments, it will be understood that they are not intended to limit the invention to these embodiments. On the contrary, the invention is intended to cover alternatives, modifications and equivalents, which may be included within the spirit and scope of the invention as defined by the appended Claims.

Furthermore, in the following description of embodiments of the present invention, numerous specific details are set forth in order to provide a thorough understanding of the present invention. However, it should be appreciated that embodiments of the present invention may be practiced without these specific details. In other instances, well known methods, procedures, and components have not been described in detail as not to unnecessarily obscure embodiments of the present invention.

Figure 1:
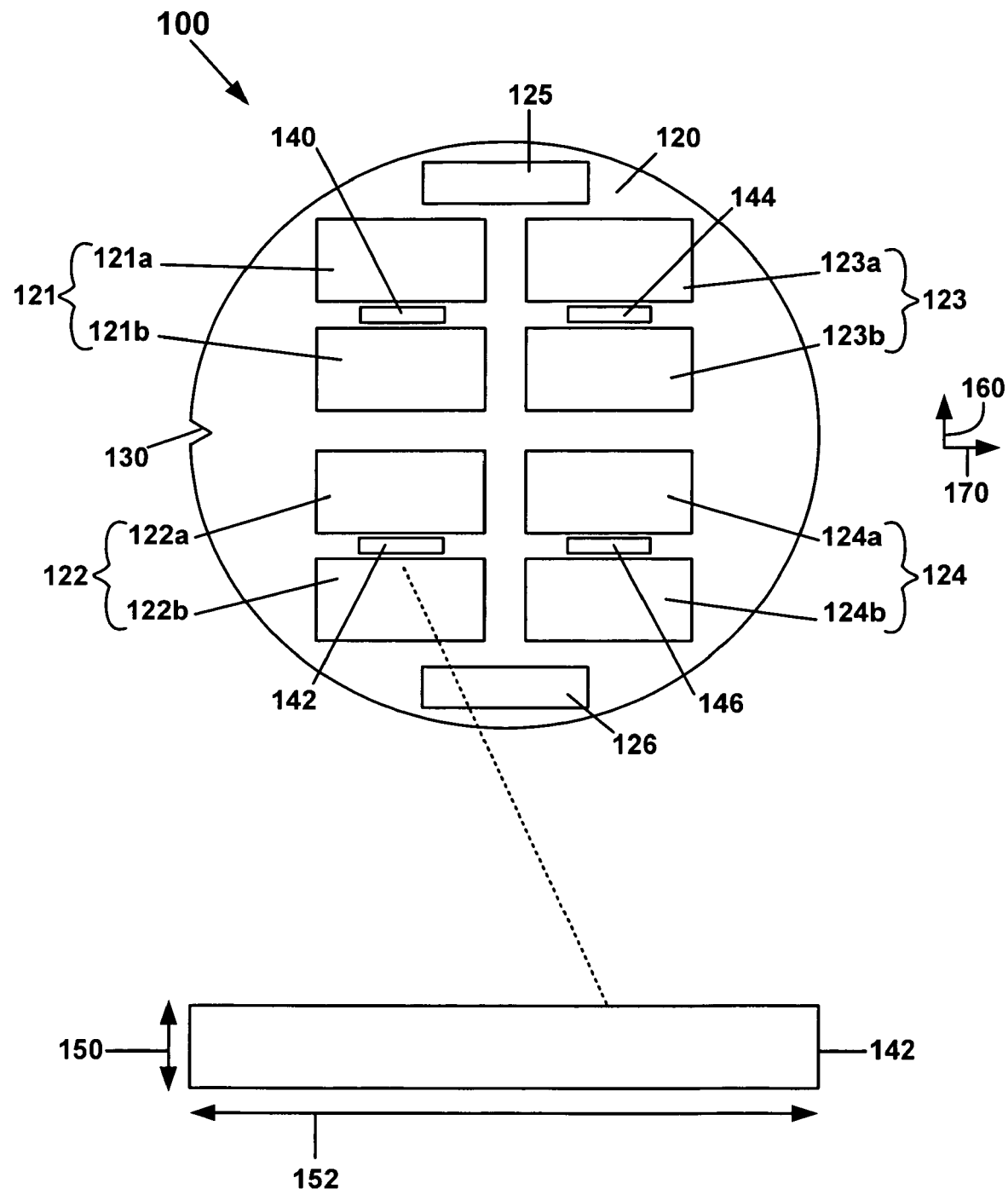
FIG. 1 is diagram illustrating the location of a test device on a manufacturable wafer and approximate dimensions of the test device on the manufacturable wafer in an embodiment of the present invention.

Physical Description of Embodiments of the Present Invention for a Test Device for Measurement of TMR Properties of a Manufacturable Wafer by the CIPT Technique With reference to FIG. 1, in accordance with an embodiment of the present invention 100, the location of a test device 142 on a manufacturable wafer 120, having a diameter of about five inches, is shown. An enlarged view of the test device 142 at the bottom of the FIG. 1 shows the test device 142 in greater detail, highlighting the approximate dimensions of the test device 142; the test device 142 comprises an approximately rectangular, probe-contact region, having a probe-contact-region width 150, and a probe-contact-region length 152. As shown, the manufacturable wafer 120 for fabricating magnetic-recording heads comprises a set of "quads" 121, 122, 123, 124, 125 and 126, areas in which rows, shown as horizontal lines within the quads, and columns (not shown) of magnetic-recording heads are fabricated. The columns run parallel to direction 160 and the rows run parallel to direction 170; the manufacturable wafer 120 is also provided with an alignment feature 130, shown in FIG. 1 as a notch, for alignment purposes during the manufacturing process.

With further reference to FIG. 1, in accordance with the embodiment of the present invention 100, each quad comprises mini-quads; as shown, quads 121, 122, 123 and 124 comprise respectively the following mini-quads: 121a and 121b, 122a and 122b, 123a and 123b, and 124a and 124b. The mini-quads are important, because the test devices are located in the space between the mini-quads and are centrally located within the quads to characterize the TMR properties of the TMR sensor-layer structure of a particular quad. This arrangement facilitates "yielding" the wafer, a term of art which refers to making a selection of quads with good TMR properties for further fabrication. For example, if a manufacturable wafer 120 shows that the TMR sensor-layer structures of all four quads have poor TMR properties, the entire manufacturable wafer 120 would be scrapped and significant production costs saved by testing the manufacturable wafer 120 with the test devices associated with each quad in an early phase of fabrication, when the TMR sensors are only partially fabricated. On the other hand, if only one quad shows marginal TMR properties, then the manufacturable wafer 120 might continue through with the remainder of the fabrication process, with the marginal quad of the manufacturable wafer 120 flagged for rejection at the back end of the process stream.

With further reference to FIG. 1, in accordance with the embodiment of the present invention 100, it should be recognized that at this phase in the fabrication process the combined manufacturable wafer 120 and test device 142 comprise a TMR sensor-layer structure disposed on a substrate and a plurality of partially fabricated TMR sensors. The plurality of partially fabricated TMR sensors are such that at least one of the partially fabricated TMR sensors is disposed at one of a plurality of first locations; these first locations being situated in the quads 121, 122, 123, 124, 125 and 126, excluding the space between the mini-quads 121a and 121b, 122a and 122b, 123a and 123b, and 124a and 124b. Moreover, the test device 142 is disposed on the substrate at a second location different from the plurality of first locations, namely the space between the mini-quads 122a and 122b. The arrangement is such that the test device 142 allows measurement of a TMR property of the TMR sensor-layer structure using the CIPT technique. Also, it should be appreciated that the plurality of test devices 140, 144 and 146 allow the measurement of TMR properties of the TMR sensor-layer structure using the CIPT technique at the plurality of respective, second locations in the space between the respective mini-quads 121a and 121b, 123a and 123b, and 124a and 124b. In the future, with further miniaturization of TMR sensor dimensions and the use of larger wafers having six inch, eight inch, ten inch and larger wafer diameters in the batch-processing, fabrication process, it is anticipated that a manufacturable wafer may have eight, sixteen, and even more such test devices individually located at second locations. It should also be recognized that a wafer-testing means for measuring the TMR property of the TMR sensor-layer structure may comprise the test device 142.

Figure 2:
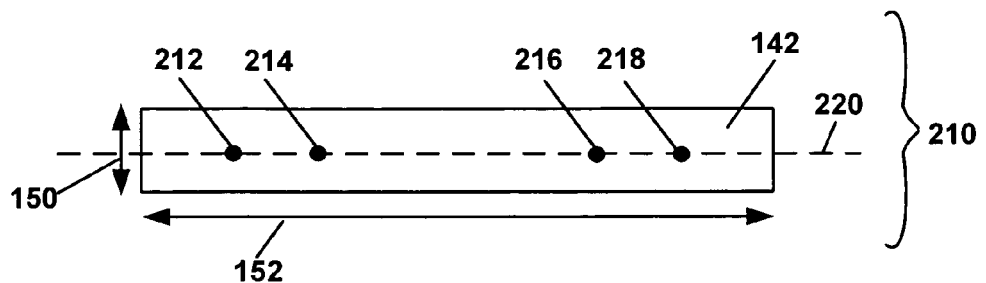
FIG. 2 is a combined elevation and cross-sectional view of a test device on a manufacturable wafer for measuring a TMR property of a TMR sensor-layer structure in an embodiment of the present invention.
Figure 2:
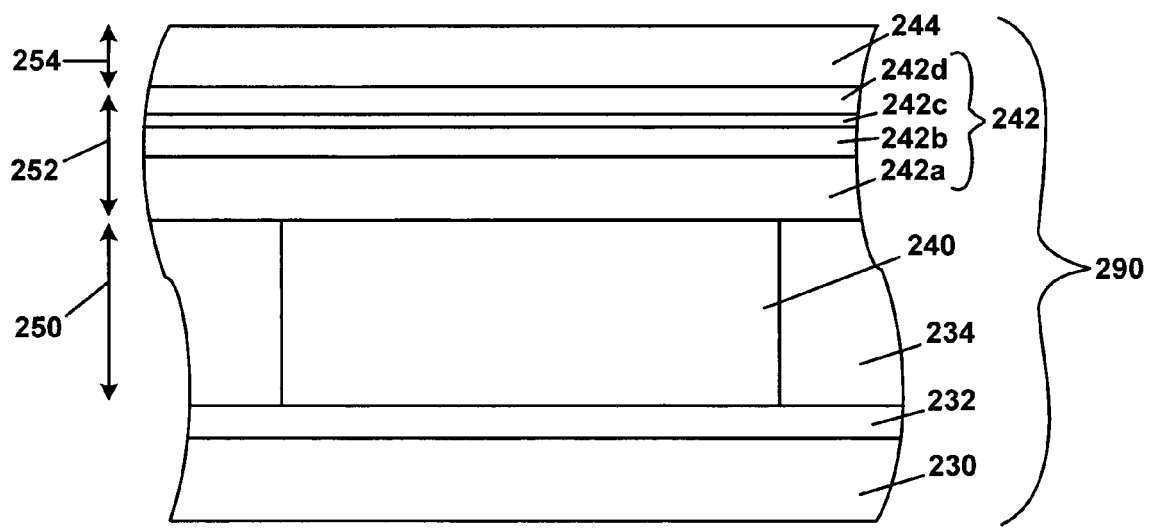

With reference now to FIG. 2, in accordance with an embodiment of the present invention 200, a combined elevation 210 and cross-sectional view 290 of the test device 142 on the manufacturable wafer 120 is shown. The elevation view 210 of the test device 142 is the same as shown in the enlarged view of the test device 142 in FIG. 1. However, a center line through the test device 142 parallel to the direction 170 is shown indicating the location of probe-contact points 212, 214, 216 and 218 within the test device 142 comprising an approximately rectangular, probe-contact region; the length of the rectangular, probe-contact region, e.g. probe-contact-region length 152, is greater than approximately 1.5 mm. As shown 1.5 mm is about the minimum dimension to accommodate the four probe-contact points 212, 214, 216 and 218 of a four-point probe using the in-line probe arrangement for measuring a TMR property of the TMR sensor-layer structure; the probe-contact-region width 150 may be on the order of several hundred micrometers to accommodate the windages, the alignment errors, involved in placing the four probes carried by a tester head attached to the arm of a robotic tester (not shown).

With further reference to FIG. 2, in accordance with the embodiment of the present invention 200, the cross-sectional view 290 taken along the center line 220 of the test device 142 is shown. The test device 142 further comprises a first electrical-contact layer 240 and a second electrical-contact layer 244 disposed on and in electrical contact with the TMR sensor-layer structure 242; the TMR sensor-layer structure 242 is disposed on and in electrical contact with the first electrical-contact layer 240. The TMR sensor-layer structure 242 comprises a pinning layer 242a, a pinned ferromagnetic layer 242b, a tunnel-barrier layer 242c, and a free ferromagnetic layer 242d; other layers, which are within the scope and spirit of the present invention, may also be present in the TMR sensor-layer structure 242. It should be appreciated that the tunnel-barrier layer 242c is a high resistance barrier to the flow of current from test probes used to characterize a TMR property of the TMR sensor-layer structure 242 such as: a TMR ratio of the TMR sensor-layer structure 242, and a resistance-area product of the TMR sensor-layer structure 242. The first electrical-contact layer 240 has a first-electrical-contact-layer thickness 250, the second electrical-contact layer 244 has a second-electrical-contact-layer thickness 254, and the TMR sensor-layer structure 242 has a TMR-sensor-layer-structure thickness 252. The first-electrical-contact-layer thickness 250 may be on the order of several thousand nanometers (nm); similarly, the second-electrical-contact-layer thickness 254 may be on the order of several thousand nanometers; but, the thickness of the two layers may be adjusted so that the sheet resistance of the second electrical-contact layer 244 is about three times greater than the sheet resistance of the first electrical-contact layer 240. The TMR-sensor-layer-structure thickness 252 may range from about 10 nm up to about 25 nm. The thicknesses of the individual layers of the TMR sensor-layer structure 242 may be: 3 nm to 7 nm for the pinning layer 242a; 2.5 nm to 4.5 nm for the pinned ferromagnetic layer 242b; 0.8 nm to 1.4 nm for the tunnel-barrier layer 242c; and, 3.5 nm to 5.5 nm for the free ferromagnetic layer 242d. The relative thicknesses, sheet resistances and/or resistance-area products, and placement of the probes will determine the effectiveness of the measurements made with the test device, as will be further described below.

With further reference to FIG. 2, in accordance with the embodiment of the present invention 200, the TMR sensor-layer structure 242 is disposed on a substrate 230; an electrically insulating undercoat layer 232, e.g. an alumina ($Al_2O_3$) layer, is disposed on top of and in contact with the substrate 230. The first electrical-contact layer 240 may be disposed on top of and in contact with the electrically insulating undercoat layer 232; alternatively, the first electrical-contact layer 240 may further comprise more than a single layer of material, such as intervening layers between the electrically insulating undercoat layer 232 and an upper-layer portion of the first electrical-contact layer 240, e.g. a heater layer disposed under and in electrical contact with a heater-lead layer (not shown) that may be component parts of a thermal-fly-height-control (TFC) system. A field insulating oxide layer 234, e.g. an alumina ($Al_2O_3$) layer, surrounds the first electrical-contact layer 240 on four sides defining the lateral dimensions of the first electrical-contact layer 240: a first-electrical-contact-layer width, and a first-electrical-contact-layer length; the first-electrical-contact-layer width, and the first-electrical-contact-layer length define the approximately rectangular, probe-contact region of the test device 142, the probe-contact-region width 150 being identified with the first-electrical-contact-layer width, and the probe-contact-region length 152 being identified with the first-electrical-contact-layer length. It should be appreciated that after deposition of the first electrical-contact layer 240, it is patterned photolithographically defining the lateral dimensions of the first electrical-contact layer 240; subsequently the field insulating oxide layer 234 is deposited as a blanket film over the patterned first electrical-contact layer 240 and the entire structure is planarized, e.g. in a chemical-mechanical polishing (CMP) process, to remove portions of the field insulating oxide layer 234 lying on top of the first electrical-contact layer 240; the resulting pattern in the field insulating oxide layer 234 defined by the sidewalls of the patterned first electrical-contact layer 240 in conjunction with the electrically insulating undercoat layer 232 creates a well-structure within which the conductive material of the first electrical-contact layer 240 under the TMR sensor-layer structure 242 is contained; the electrically insulating undercoat layer 232 forms the bottom of the well-structure, and the sidewalls of field insulating oxide layer 234 defined by the sidewalls of the patterned first electrical-contact layer 240 define the sides of the well-structure. It should be appreciated that the sides of the well-structure define the lateral dimensions of the test device 142 wherein the first electrical-contact layer 240 is patterned for localizing a testing current substantially within the test device 142.

With further reference to FIG. 2, in accordance with the embodiment of the present invention 200, the first electrical-contact layer 240 may comprise a first shield layer wherein the first shield layer is patterned for localizing a testing current substantially within the test device 142. It should be appreciated that the first shield layer provides a shielding function for the fully fabricated TMR sensor, but that, at this point in the fabrication process, the first shield layer has been photolithographically patterned to form a shield portion of a plurality of partially fabricated TMR sensors. Also, the first electrical-contact layer 240 may comprise a layer comprising nickel and iron, e.g. permalloy, wherein the layer is patterned for localizing a testing current substantially within the test device 142. It should be appreciated that permalloy is often used as the alloy for the first shield layer. To facilitate the localization of the testing current substantially within the test device 142, the first electrical-contact layer 240 may comprise a layer having a sheet resistance less than about 0.2 Ohm per square. If other layers, e.g. the heater layer and the heater-lead layer, are present under an upper-layer portion of the first electrical-contact layer 240 and disposed between the upper-layer portion of the first electrical-contact layer 240 and the electrically insulating undercoat layer 232, it should be recognized that these other layers may be similarly patterned for localizing a testing current substantially within the test device 142.

With further reference to FIG. 2, in accordance with the embodiment of the present invention 200, the second electrical-contact layer 244 of the test device 142 may comprise an electrically conductive mask alignment layer. The second electrical-contact layer 244 may comprise a layer comprising copper; and, the second electrical-contact layer 244 may comprise a layer having a sheet resistance less than about 0.2 Ohm per square. If the sheet resistance of the second electrical-contact layer 244 is less than about 0.2 Ohm per square, it should be appreciated that the sheet resistance of the first electrical-contact layer 240 may be adjusted so that the sheet resistance of the second electrical-contact layer 244 is about three times greater than the sheet resistance of the first electrical-contact layer 240, which may be accomplished by increasing the thickness of the first electrical-contact layer 240, as discussed above. It should be appreciated that the test device 142 can still provide useful results if the ratio of the thickness of the first electrical-contact layer 240 to the second electrical-contact layer 244 is as low as 1:1 and as high as 10:1, and that thickness ratios within the range of 1:1 to 10:1, such as the 3:1 ratio described above, are within the scope and purview of embodiments of the present invention.

Figure 3A:
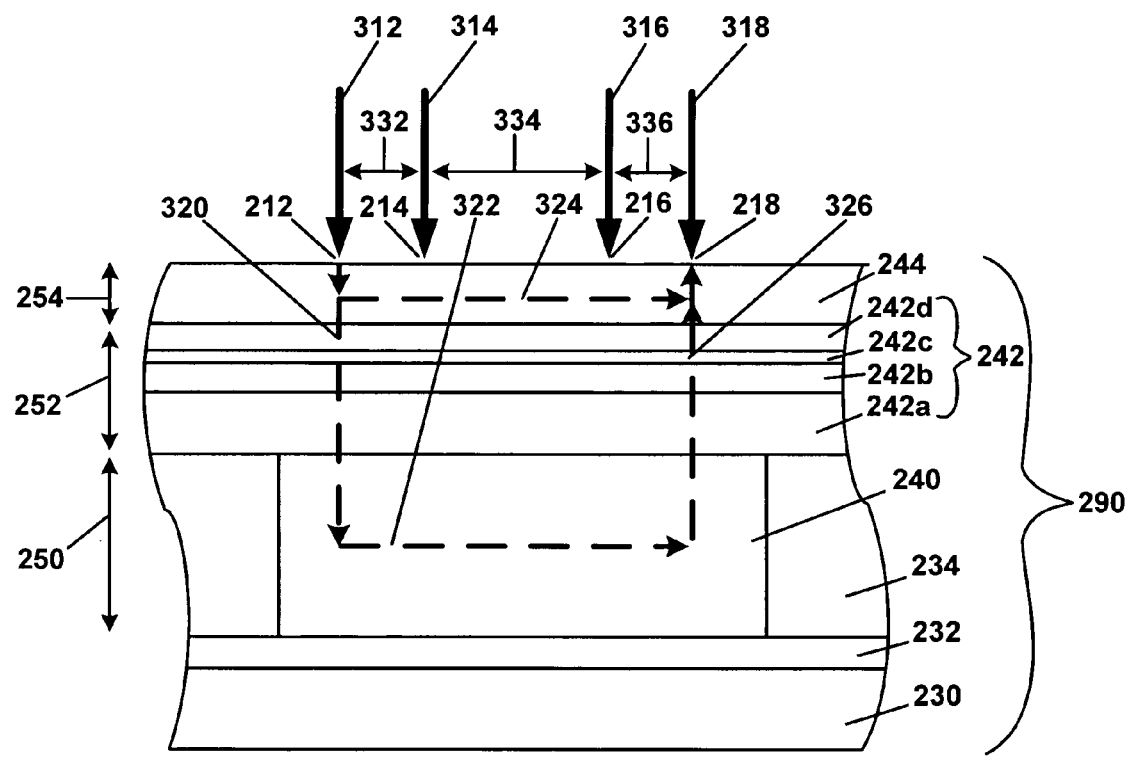
FIGS. 3A and 3B are a combined cross-sectional view and model circuit of a test device on a manufacturable wafer illustrating the use of the test device for measuring a TMR property of a TMR sensor-layer structure by application of a four-point probe in an embodiment of the present invention.
Figure 3B:
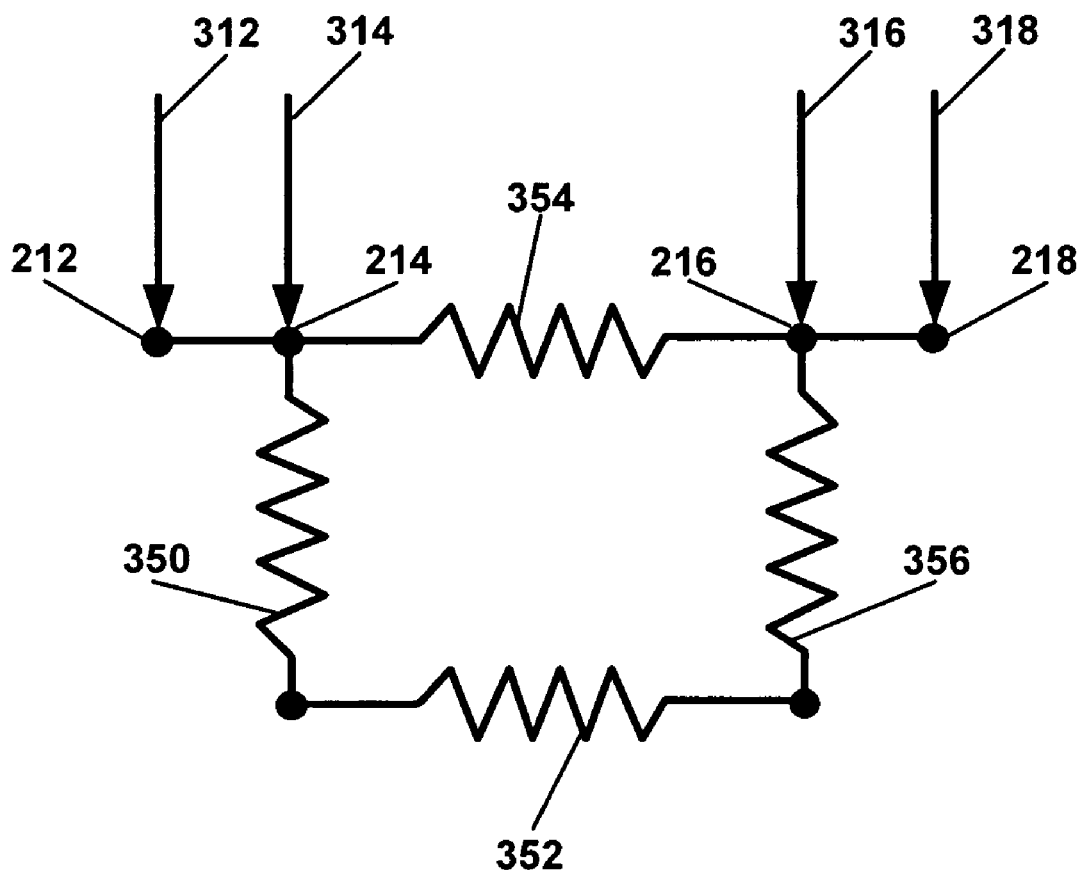

With reference now to FIGS. 3A and 3B, in accordance with the embodiment of the present invention 300, an arrangement for measuring a TMR property of a TMR sensor-layer structure 242 by application of a four-point probe is shown. FIG. 3A is a cross-sectional view illustrating the disposition of the four-point probe on the test device 142. The four-point probe comprises probe tips 312, 314, 316 and 318; the probe tips 312, 314, 316 and 318 are disposed on the test device 142 within the approximately rectangular, probe-contact region with probe-contact-region width 150, and probe-contact-region length 152 at the location of the probe-contact points 212, 214, 216 and 218, respectively. In an embodiment of the present invention, the probe tips 312 and 318 that are outermost may apply a current to the test device 142 at the probe-contact points 212 and 218, respectively; as shown in FIG. 3A, the current flows through the test device 142 from the probe tip 312 that is at a positive potential to the probe tip 318 that is at a negative potential as indicated by the arrows along the current paths 320, 322, 324 and 326. The probe tips 314 and 316 that are innermost may measure the voltage drop between the probe-contact points 214 and 216 to the test device 142, as for a typical four-point probe arrangement. The probe tips are separated by the probe-tip spacings 332, 334 and 336 between, respectively, probe tips: 312 and 314, 314 and 316, and 316 and 318; and, the probe tips are arranged along the center line 220 making contact at the probe-contact points 212, 214, 216 and 218, as shown in the elevation view 210 of FIG. 2. It should be appreciated that by judicious choice of the probe-tip spacings 332, 324 and 326, for given values of the test device 142 film thicknesses, e.g. the first-electrical-contact-layer thickness 250, the second-electrical-contact-layer thickness 254, and the TMR-sensor-layer-structure thickness 252, the test device 142 allows measurement of a TMR property of the TMR sensor-layer structure 242 using the CIPT technique.

With further reference to FIGS. 3A and 3B, in accordance with the embodiment of the present invention 300, a model circuit of a test device 142 is shown in FIG. 3B that illustrates the way in which CIPT technique is used to measure a TMR property of the TMR sensor-layer structure 242. This model circuit is for heuristic purposes only, emphasizing the basic physics of current flow in the test device 142, as actual current flow is more complex. It should be recognized that, if the probe spacings 332 and 336 are close enough, there is very little resistance between the contact points 212 and 214, and the contact points 216 and 218, and correspondingly between the current probe 312 and the voltage probe 314, and the current probe 318 and the voltage probe 316, respectively, which is shown by the absence of any resistor between the contact points 212 and 214, and the contact points 216 and 218 of the model circuit of the test device 142 shown in FIG. 3B. Neglecting current spreading, the resistors 350, 352, 354 and 356 in the model circuit correspond to the current paths 320, 322, 324 and 326, respectively. Thus, to obtain a resistance measurement related to a TMR property of the TMR sensor-layer structure 242 using the CIPT technique, the resistance along the current path 324 in the second electrical-contact layer 244 is increased relative to the resistance in the parallel current path comprised of current paths 320, 322 and 326 through the TMR sensor-layer structure 242, the first electrical-contact layer 240 and back a second time through the TMR sensor-layer structure 242; this is accomplished by making the sheet resistance of second electrical-contact layer 244 three times larger than the sheet resistance of the first electrical-contact layer 240, and by making the sheet resistance of both the first electrical-contact layer 240 and the second electrical-contact layer 244 less than about 0.2 Ohm per square. It should be appreciated that the resistance in the parallel current path comprised of current paths 320, 322 and 326 is due primarily to the current paths 320 and 326 strongly affected by the resistance of the TMR sensor-layer structure 242. It should also be appreciated that the low resistance of the well-structure containing the conductive material of the first electrical-contact layer 240 under the TMR sensor-layer structure 242 combined with the electrical isolation of the well-structure from possible current-leakage paths by the electrically insulating undercoat layer 232 and the field insulating oxide layer 234 localizes a testing current substantially within the test device 142 for measuring a TMR property of the TMR sensor-layer structure 242. In this context, "substantially" means that the current is localized within the constraints imposed by current spreading through the thin-film layers connecting the probe tips. The localization of a testing current substantially within the test device 142 is realized even though the layers comprising the TMR sensor-layer structure 242 and the second electrical-contact layer 244 are essentially blanket, continuous layers covering the entire surface of the manufacturable wafer 120 at this stage in the fabrication process. In this context, "essentially" means that the TMR sensor-layer structure 242 and the second electrical-contact layer 244 may have only minimal amounts of patterning in localized areas that are remote enough from the sites of the test devices 140, 142, 144 and 146 so as not to significantly affect measuring a TMR property of the TMR sensor-layer structure 242.

With further reference to FIGS. 3A and 3B, in accordance with the embodiment of the present invention 300, it should be recognized that the TMR property may comprise the TMR property selected from a group consisting of a TMR ratio of the TMR sensor-layer structure 242 and a resistance-area product of the TMR sensor-layer structure 242. In order to measure the TMR ratio of the TMR sensor-layer structure 242, the so-called $\Delta R/R$ ratio, it is necessary to place the wafer between the pole pieces of field-sweeping magnet, such as used in a magnetometer, and to apply a magnetic field to the TMR sensor-layer structure 242 in which the magnetizations of the pinned ferromagnetic layer 242b and a free ferromagnetic layer 242d are aligned parallel and then anti-parallel to determine the resistance change $\Delta R$. The use of such a field-sweeping magnet is also required for a TMR property of the TMR sensor-layer structure 242 that may comprise measuring a transfer curve of the TMR sensor-layer structure 242, and determining a transfer-curve parameter of the TMR sensor-layer structure 242 selected from a group consisting of a transfer-curve slope, a transfer-curve hysteresis, and a transfer-curve, hysteresis-loop area.

Figure 4:
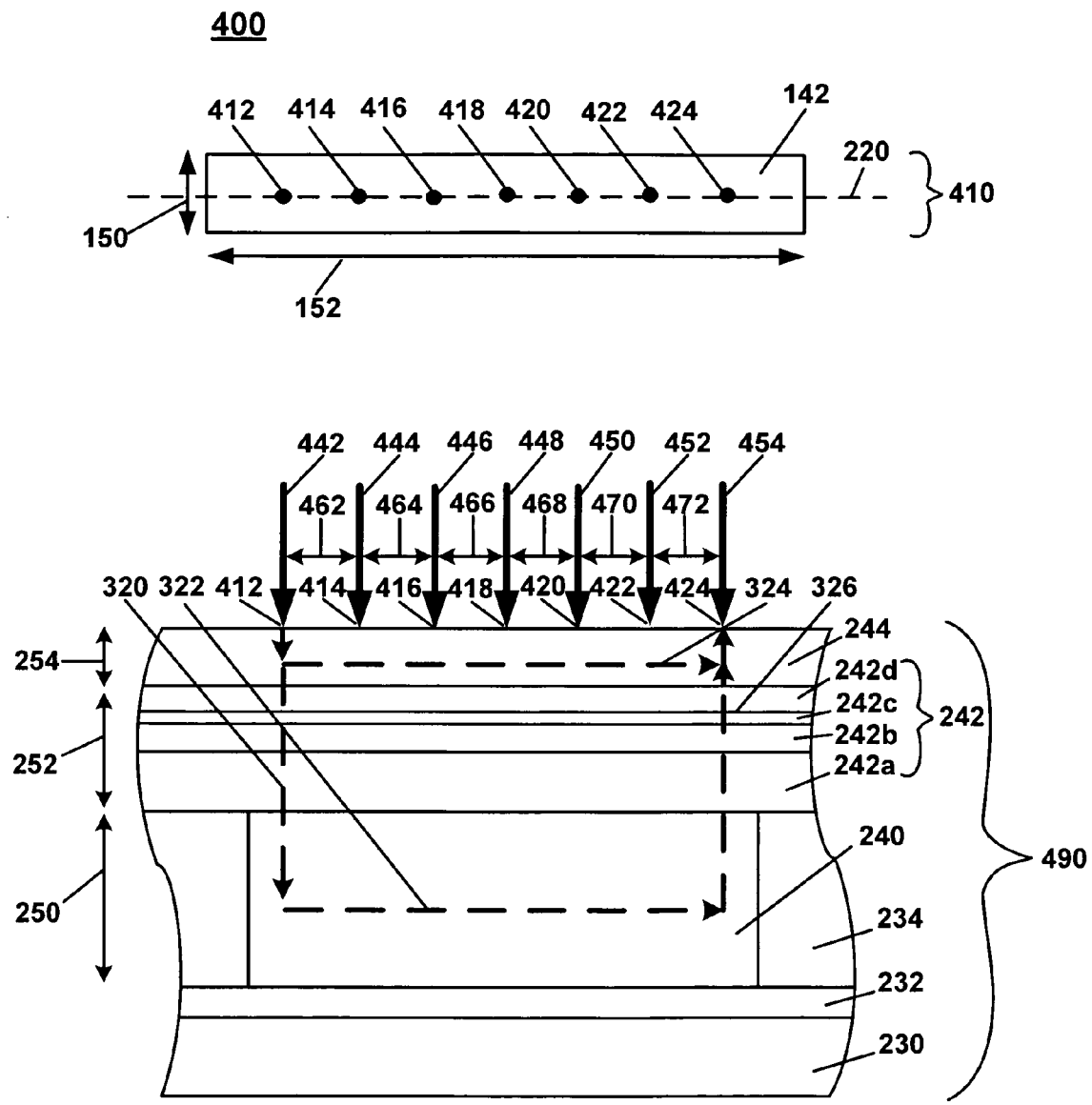
FIG. 4 is a combined elevation and cross-sectional view of a test device on a manufacturable wafer illustrating the use of the test device for measuring a TMR property of a TMR sensor-layer structure by application of a multi-point probe in an embodiment of the present invention.

With reference now to FIG. 4, in accordance with an embodiment of the present invention 400, an arrangement for measuring a TMR property of a TMR sensor-layer structure 242 by application of a multi-point probe, such as made by Capres A/S of Denmark, is shown. A combined elevation view 410 and cross-sectional view 490 of a test device 142 on a manufacturable wafer 120 are shown in FIG. 4. In the elevation view 410, the center line 220 through the test device 142 parallel to the direction 170 is shown indicating the location of probe-contact points 412, 414, 416, 418, 420, 422 and 424 within the approximately rectangular, probe-contact region of the test device 142; but, the length of the rectangular, probe-contact region, e.g. probe-contact-region length 152, may be substantially greater than the minimum length 1.5 mm of a four-point probe, e.g. several millimeters to accommodate the multiple probe tips 442, 444, 446, 448, 450, 452 and 454 shown making contact with the test device 142 at the locations of the probe-contact points 412, 414, 416, 418, 420, 422 and 424, respectively, as shown in the cross-section view 490. The probe tips are separated by the probe-tip spacings 462, 464, 466, 468, 470, and 472 between, respectively, probe tips: 442 and 444, 444 and 446, 446 and 448, 448 and 450, 450 and 452, and 452 and 454; and, the probe tips are arranged along the center line 220 making contact at the probe-contact points 412, 414, 416, 418, 420, 422 and 424, as shown in the elevation view 410 of FIG. 4. Although seven probe tips are shown in FIG. 4, the multi-point probe may have as many as twelve or more probe tips. Any four of these may be addressed with a multiplexer for making four-point-probe measurements along a line of variable dimension along the center-line 220 of the test device 142. It should be recognized that using the multi-point probe a TMR property such as the TMR ratio of the TMR sensor-layer structure 242 and a resistance-area product of the TMR sensor-layer structure 242 may be measured.

Figure 5:
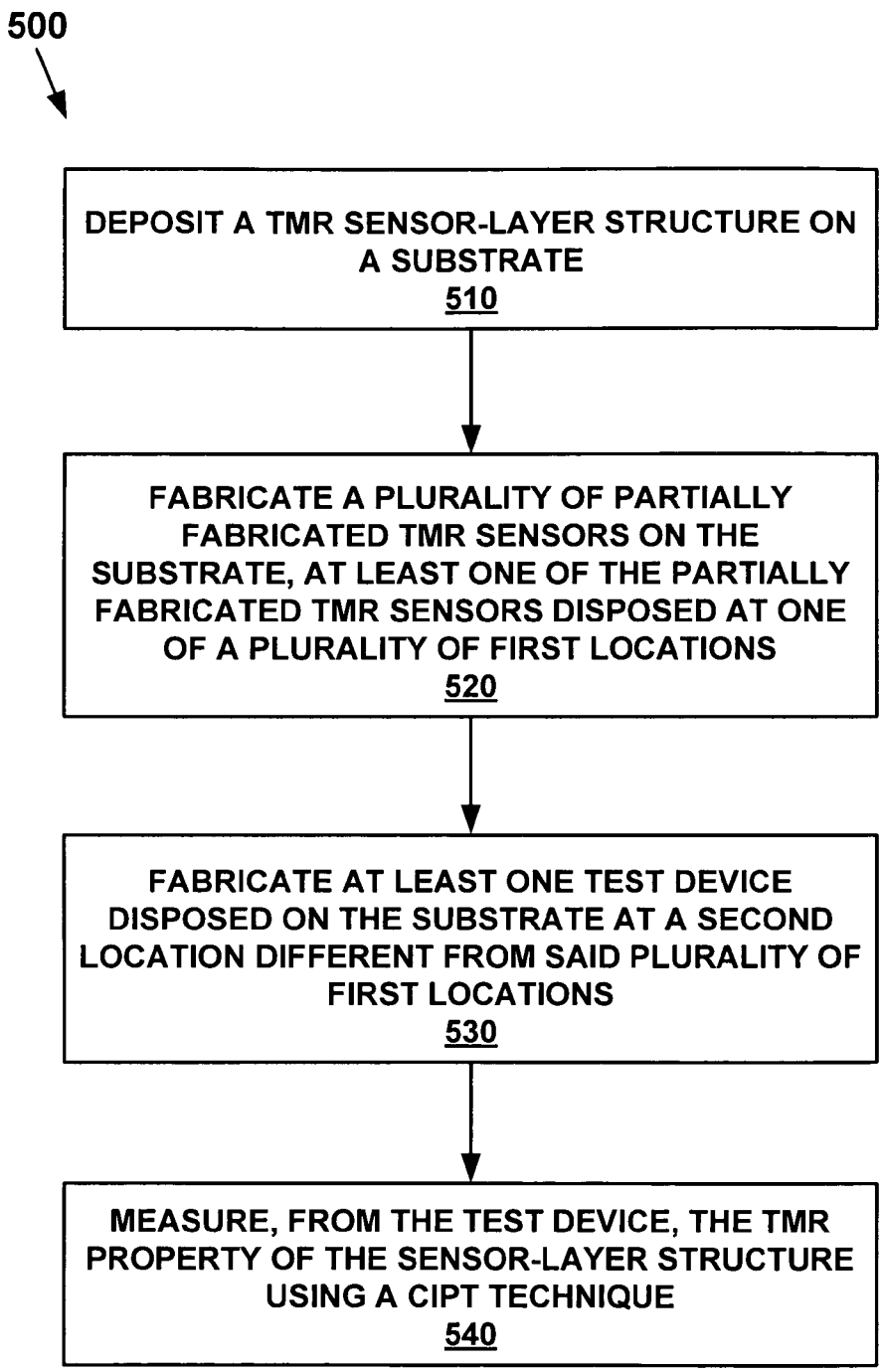
FIG. 5 is a flow chart illustrating a method for measuring a TMR property of a TMR sensor-layer structure of a manufacturable wafer with a test device in an embodiment of the present invention.

Description of Embodiments of the Present Invention for a Method for Measurement of TMR Properties of a Manufacturable Wafer by the CIPT Technique With reference now to FIG. 5, a flow chart illustrates an embodiment of the present invention 500 for a method for measuring a TMR property of a TMR sensor-layer structure 242 of a manufacturable wafer 120 with a test device 142. The method for measuring a TMR property of a TMR sensor-layer structure 242 of a manufacturable wafer 120 with a test device 142 comprises four manufacturing-process instructions: 510, 520, 530 and 540. 510, deposit a TMR sensor-layer structure 242 on a substrate 230. 520, fabricate a plurality of partially fabricated TMR sensors on the substrate 230, at least one of the partially fabricated TMR sensors disposed at one of a plurality of first locations. 530, fabricate at least one test device 142 disposed on the substrate 230 at a second location different from the plurality of first locations. 540, measure, from the test device 142, the TMR property of the TMR sensor-layer structure 242 using a current-in-plane-tunneling technique.

Figure 6:
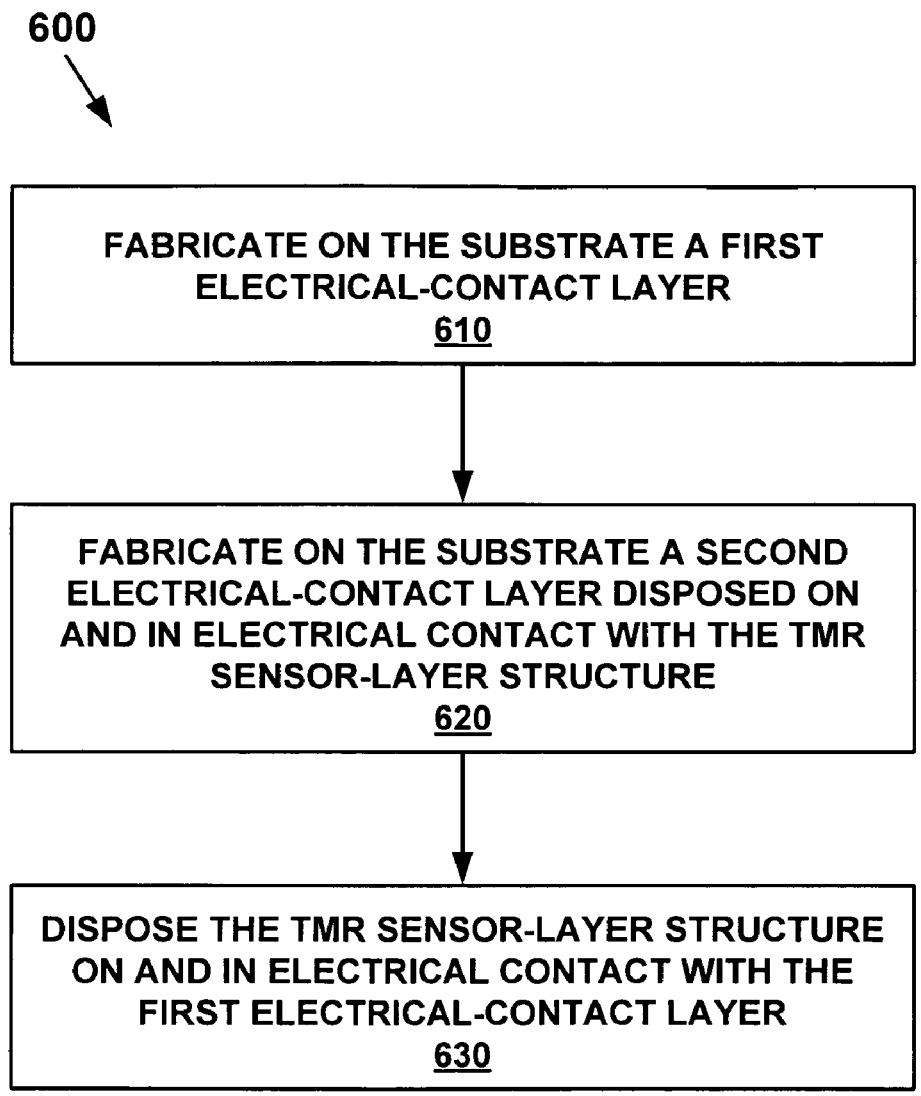
FIG. 6 is a flow chart further illustrating a method for measuring a TMR property of a TMR sensor-layer structure of a manufacturable wafer with a test device and elaborating the method of fabricating the test device in an embodiment of the present invention.

With reference to FIG. 6, a flow chart illustrates an embodiment of the present invention 600 for a method for measuring a TMR property of a TMR sensor-layer structure 242 of a manufacturable wafer 120 with a test device 142 that further comprises three manufacturing-process instructions: 610, 620, and 630. 610, fabricate on the substrate 230 a first electrical-contact layer 240. 620, fabricate on the substrate 230 a second electrical-contact layer 244 disposed on and in electrical contact with the TMR sensor-layer structure 242. 630, dispose the TMR sensor-layer structure 242 on and in electrical contact with the first electrical-contact layer 240.

Figure 7:
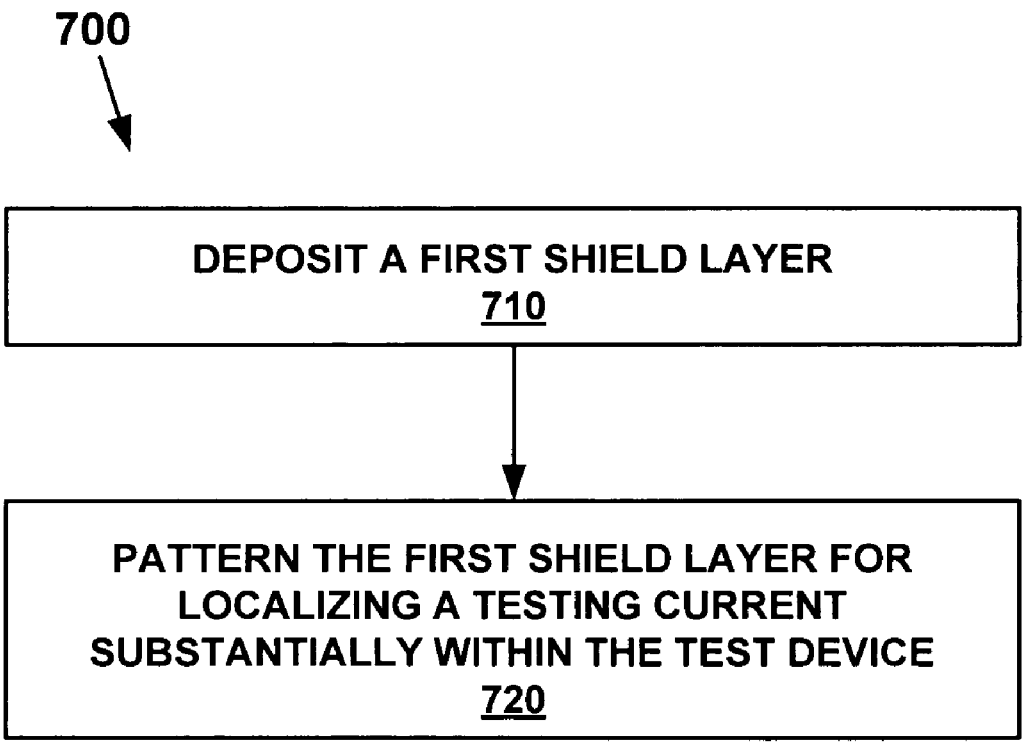
FIG. 7 is a flow chart further illustrating a method for measuring a TMR property of a TMR sensor-layer structure of a manufacturable wafer with a test device and elaborating the method of fabricating the first electrical-contact layer of the test device in an embodiment of the present invention.

With reference to FIG. 7, a flow chart illustrates an embodiment of the present invention 700 wherein the manufacturing-process instruction 610 to fabricate the first electrical-contact layer 240 further comprises two manufacturing-process instructions: 710 and 720. 710, deposit a first shield layer; it should be recognized that fabricating the first electrical-contact layer 240 may comprise depositing a layer comprising nickel and iron, such as permalloy, which is used as a first shield layer. 720, pattern the first shield layer for localizing a testing current substantially within the test device 142.

With reference to FIG. 8, a flow chart illustrates an embodiment of the present invention 800 wherein the method for measuring a TMR property of a TMR sensor-layer structure 242 of a manufacturable wafer 120 with a test device 142 further comprises a manufacturing-process instruction 810. 810, perform a hydrogen/nitrogen, plasma ashing of a surface of the TMR sensor-layer structure 242 before fabricating on the surface the second electrical-contact layer 244.

With reference to FIG. 9, a flow chart illustrates an embodiment of the present invention 900 wherein the manufacturing-process instruction 620 to fabricate the second electrical-contact layer 244 further comprises a manufacturing-process instruction 910. 910, deposit an electrically conductive mask alignment layer; it should be recognized that fabricating the second electrical-contact layer 244 may comprise depositing a layer of copper, which is used as the electrically conductive mask alignment layer.

Figure 10:
FIG. 10 is a flow chart further illustrating a method for measuring a TMR property of a TMR sensor-layer structure of a manufacturable wafer with a test device and elaborating the sensor-layer-structure parameters measurable with the test device in an embodiment of the present invention.

With reference to FIG. 10, a flow chart illustrates an embodiment of the present invention 1000 wherein the manufacturing-process instruction 540 to measure, from the test device 142, the TMR property of the TMR sensor-layer structure 242 using a current-in-plane-tunneling technique further comprises a manufacturing-process instruction 1010. 1010, measure the TMR property selected from a group consisting of a TMR ratio of the TMR sensor-layer structure 242 and a resistance-area product of the TMR sensor-layer structure 242.

Figure 11:
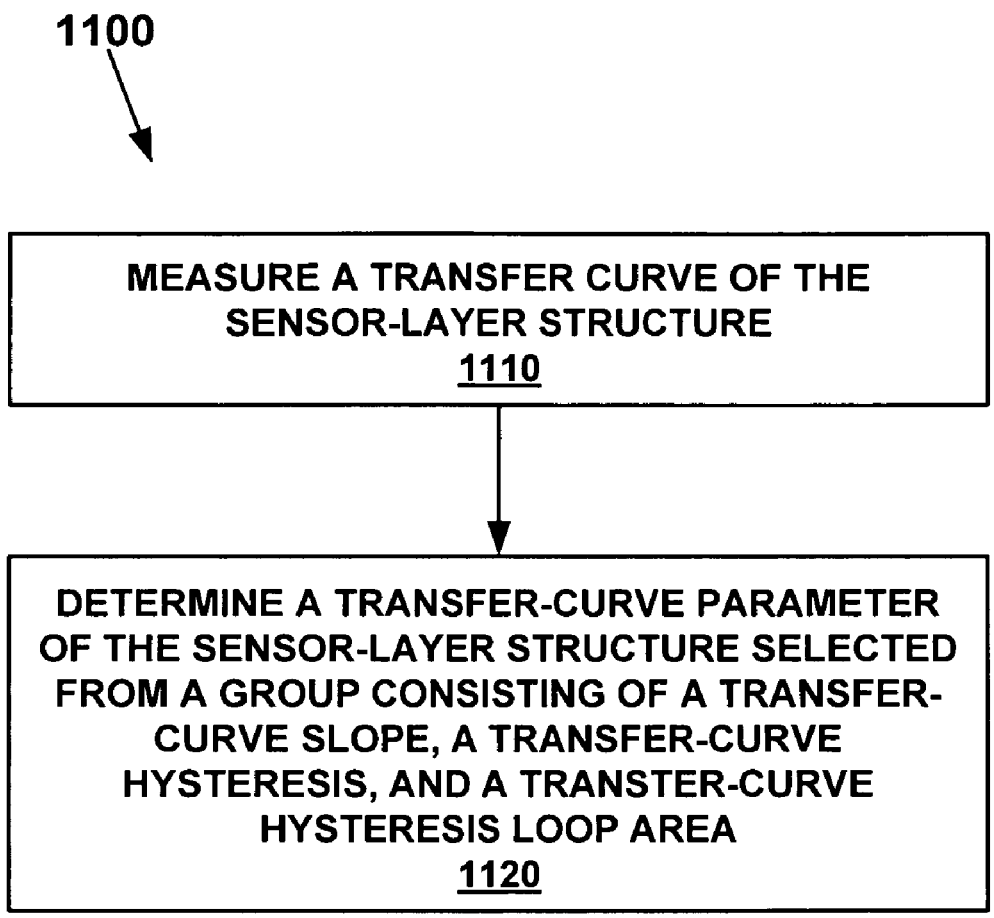
FIG. 11 is a flow chart further illustrating a method for measuring a TMR property of a TMR sensor-layer structure of a manufacturable wafer with a test device and elaborating the transfer-curve parameters of the sensor-layer-structure measurable with the test device in an embodiment of the present invention.

With reference to FIG. 11, a flow chart illustrates an embodiment of the present invention 1100 wherein the manufacturing-process instruction 540 to measure, from the test device 142, the TMR property of the TMR sensor-layer structure 242 using a current-in-plane-tunneling technique further comprises two manufacturing-process instructions: 1110 and 1120. 1110, measure a transfer curve of the TMR sensor-layer structure 242. 1120, determine a transfer-curve parameter of the TMR sensor-layer structure 242 selected from a group consisting of a transfer-curve slope, a transfer-curve hysteresis, and a transfer-curve, hysteresis-loop area.

The foregoing descriptions of specific embodiments of the present invention have been presented for purposes of illustration and description. They are not intended to be exhaustive or to limit the invention to the precise forms disclosed, and many modifications and variations are possible in light of the above teaching. The embodiments described herein were chosen and described in order to best explain the principles of the invention and its practical application, to thereby enable others skilled in the art to best utilize the invention and various embodiments with various modifications as are suited to the particular use contemplated. It is intended that the scope of the invention be defined by the Claims appended hereto and their equivalents.

What is claimed is:

1. A combined manufacturable wafer and test device for measuring a tunneling-magnetoresistance property of a tunneling-magnetoresistance, sensor-layer structure, said combined manufacturable wafer and test device comprising:
    a tunneling-magnetoresistance, sensor-layer structure disposed on a substrate; and
    a plurality of partially fabricated tunneling-magnetoresistance sensors, at least one of said partially fabricated tunneling-magnetoresistance sensors disposed at one of a plurality of first locations;
    wherein said test device is disposed on said substrate at a second location different from said plurality of first locations; and
    wherein said test device allows measurement of said tunneling-magnetoresistance property of said tunneling-magnetoresistance, sensor-layer structure using a current-in-plane-tunneling technique.

2. The test device of claim 1, wherein said test device further comprises:
    a first electrical-contact layer; and
    a second electrical-contact layer disposed on and in electrical contact with said tunneling-magnetoresistance, sensor-layer structure;
    wherein said tunneling-magnetoresistance, sensor-layer structure is disposed on and in electrical contact with said first electrical-contact layer.

3. The test device of claim 2, wherein said first electrical-contact layer further comprises:
    a first shield layer wherein said first shield layer is patterned for localizing a testing current substantially within said test device.

4. The test device of claim 2, wherein said first electrical-contact layer further comprises:
    a layer comprising nickel and iron wherein said layer is patterned for localizing a testing current substantially within said test device.

5. The test device of claim 2, wherein said first electrical-contact layer further comprises:
    a layer having a sheet resistance less than about 0.2 Ohm per square.

6. The test device of claim 2, wherein said second electrical-contact layer further comprises:
    an electrically conductive mask alignment layer.

7. The test device of claim 2, wherein said second electrical-contact layer further comprises:
    a layer comprising copper.

8. The test device of claim 2, wherein said second electrical-contact layer further comprises:
    a layer having a sheet resistance less than about 0.2 Ohm per square.

9. The test device of claim 1, wherein said test device further comprises:
an approximately rectangular, probe-contact region, a length of said rectangular, probe-contact region greater than approximately 1.5 mm.

10. The test device of claim 1, wherein said tunneling-magnetoresistance property further comprises said tunneling-magnetoresistance property selected from a group consisting of a tunneling-magnetoresistance ratio of said tunneling-magnetoresistance, sensor-layer structure and a resistance-area product of said tunneling-magnetoresistance, sensor-layer structure.

11. A method for measuring a tunneling-magnetoresistance property of a tunneling-magnetoresistance, sensor-layer structure of a manufacturable wafer with a test device, said method comprising:
depositing a tunneling-magnetoresistance, sensor-layer structure on a substrate;
fabricating a plurality of partially fabricated tunneling-magnetoresistance sensors on said substrate, at least one of said partially fabricated tunneling-magnetoresistance sensors disposed at one of a plurality of first locations;
fabricating at least one test device disposed on said substrate at a second location different from said plurality of first locations; and
measuring, from said test device, said tunneling-magnetoresistance property of said tunneling-magnetoresistance, sensor-layer structure using a current-in-plane-tunneling technique.

12. The method as recited in claim 11, further comprising:
fabricating on said substrate a first electrical-contact layer; and
fabricating on said substrate a second electrical-contact layer disposed on and in electrical contact with said tunneling-magnetoresistance, sensor-layer structure;
wherein said tunneling-magnetoresistance, sensor-layer structure is disposed on and in electrical contact with said first electrical-contact layer.

13. The method as recited in claim 12, wherein said fabricating said first electrical-contact layer further comprises:
depositing a first shield layer; and
patterning said first shield layer for localizing a testing current substantially within said test device.

14. The method as recited in claim 12, wherein said fabricating said first electrical-contact layer further comprises:
depositing a layer comprising nickel and iron; and
patterning said layer comprising nickel and iron for localizing a testing current substantially within said test device.

15. The method as recited in claim 12, further comprising:
performing a hydrogen/nitrogen, plasma ashing of a surface of said tunneling-magnetoresistance, sensor-layer structure before fabricating on said surface said second electrical-contact layer.

16. The method as recited in claim 12, wherein said fabricating said second electrical-contact layer further comprises:
depositing an electrically conductive mask alignment layer.

17. The method as recited in claim 12, wherein said fabricating said second electrical-contact layer further comprises:
depositing a layer of copper.

18. The method as recited in claim 11, wherein said measuring with said test device further comprises:
measuring said tunneling-magnetoresistance property selected from a group consisting of a tunneling-magnetoresistance ratio of said tunneling-magnetoresistance, sensor-layer structure and a resistance-area product of said tunneling-magnetoresistance, sensor-layer structure.

19. The method as recited in claim 11, wherein said measuring with said test device said tunneling-magnetoresistance property of said tunneling-magnetoresistance, sensor-layer structure further comprises:
measuring a transfer curve of said tunneling-magnetoresistance, sensor-layer structure; and
determining a transfer-curve parameter of said tunneling-magnetoresistance, sensor-layer structure selected from a group consisting of a transfer-curve slope, a transfer-curve hysteresis, and a transfer-curve, hysteresis-loop area.

20. A combined manufacturable wafer and wafer-testing means for measuring a tunneling-magnetoresistance property of a tunneling-magnetoresistance, sensor-layer structure, said combined manufacturable wafer and wafer-testing means comprising:
a tunneling-magnetoresistance, sensor-layer structure disposed on a substrate; and
a plurality of partially fabricated tunneling-magnetoresistance sensors, at least one of said partially fabricated tunneling-magnetoresistance sensors disposed at one of a plurality of first locations;
wherein said wafer-testing means is disposed on said substrate at a second location different from said plurality of first locations; and
wherein said wafer-testing means for measuring said tunneling-magnetoresistance property of said tunneling-magnetoresistance, sensor-layer structure allows measurements using a current-in-plane-tunneling technique.

* * * * *